United States Patent [19]

Harshbarger

[11] 3,979,741

[45] Sept. 7, 1976

[54] POWER LOSS ALARM SYSTEM
[75] Inventor: John H. Harshbarger, Xenia, Ohio
[73] Assignee: Visual Information Institute, Inc., Xenia, Ohio
[22] Filed: June 2, 1975
[21] Appl. No.: 583,198

[52] U.S. Cl. .......................... 340/248 B; 340/253 C
[51] Int. Cl.² ......................................... G08B 21/00
[58] Field of Search ..................... 340/248 B, 253 C

[56] References Cited
UNITED STATES PATENTS
2,814,795 11/1957 Spooner ...................... 340/253 C X
3,384,886 5/1968 Serra .............................. 340/253 C FOREIGN PATENTS OR APPLICATIONS
359,050 10/1931 United Kingdom ............. 340/253 C Primary Examiner—John W. Caldwell
Assistant Examiner—Daniel Myer
Attorney, Agent, or Firm—Melvin A. Crosby

[57] ABSTRACT

A power loss alarm system in which an electric power supply is connected to a relay so that the relay is energized while the power supply is on. If the power supply fails, or if the voltage is reduced below a certain minimum amount, the relay is de-energized and an alarm signal is activated. The alarm signal is connected to second source of electric power, a battery, for example, so that power loss in the power circuit will not prevent actuation of the alarm. The system includes a selector switch having an "OFF" position, an "ON" or "RETURN" position in which the system is checked and is also operative to sound the alarm when power returns to the system, and a "LOSS" position in which the system is operative to indicate the occurrence of loss of power.

6 Claims, 1 Drawing Figure

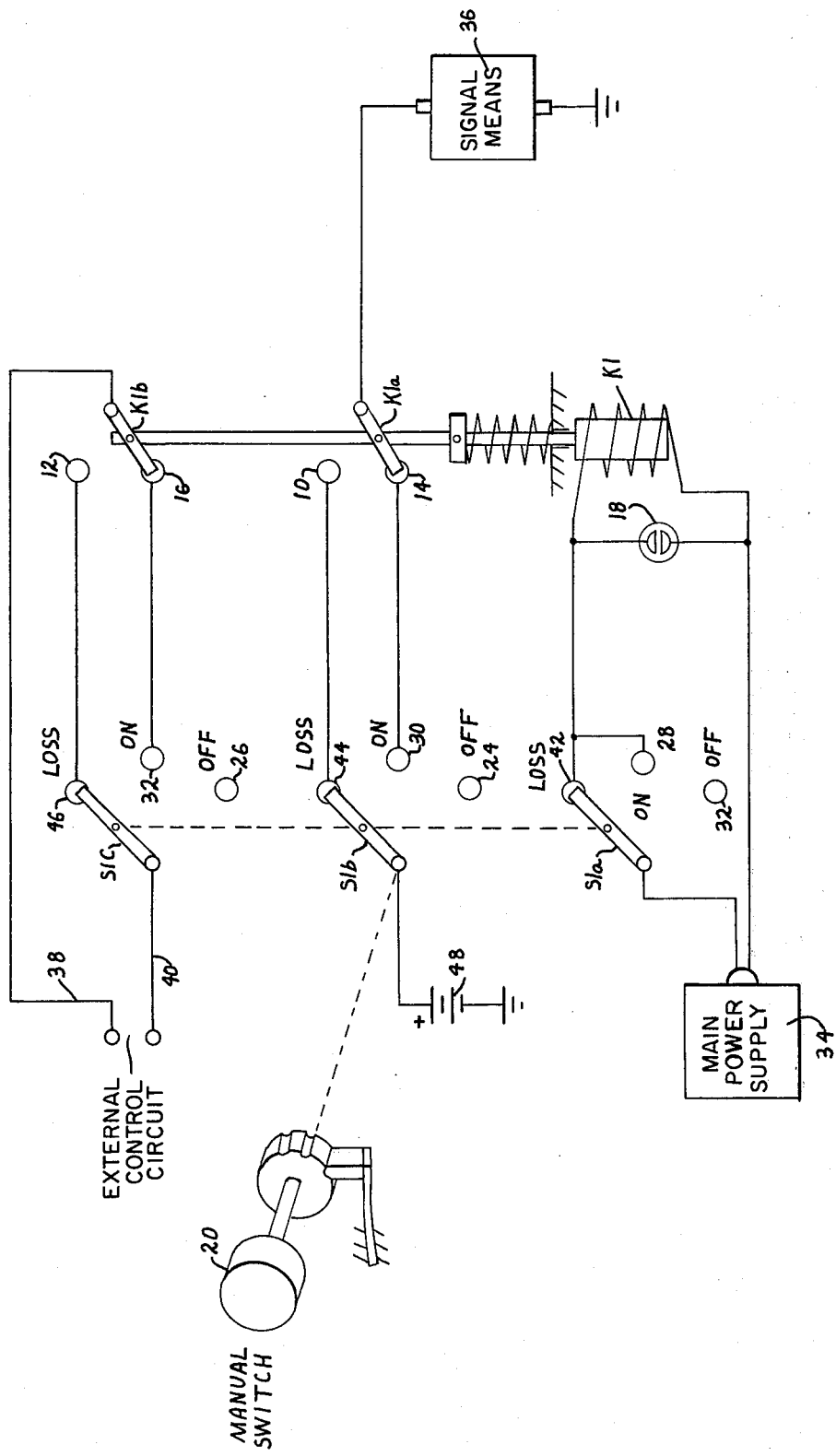

POWER LOSS ALARM SYSTEM

The present invention relates to alarm systems, and is particularly concerned with an alarm system which will indicate loss or return of electric power.

Many systems present themselves in which loss of electric power can represent a serious and potentially expensive situation. Such situations could be in connection with continuous process monitoring, the operation of incubators and the like, irrigation systems, drainage pump operations, the operation of freezers and the like or even in the event that is important to be advised of clock stoppage.

Various signaling and alarm systems have been provided for the purpose of giving an alarm, either audible or visible, or both, in the event of electric power failure but, heretofore, such devices have been relatively complicated and expensive and are often less than reliable.

With the foregoing in mind, the primary objective of the present invention is the provision of an alarm system of the nature referred to which is at once simple and inexpensive and highly reliable and which can readily be checked at any time for operating effectiveness.

A further object is the provision of an electrically operated alarm system of the nature referred to which can operate on either direct current or alternating current of any available frequency.

It is also an object of the present invention to provide a system which will be operative in the event of a predetermined reduction in the voltage of a power supply to provide an alarm signal.

It is a still further object to provide a system which will signal the return of power to the system after loss or reduction of the voltage thereof.

BRIEF SUMMARY OF THE INVENTION

According to the present invention, a signal is provided, preferably, electrically operated, with the signal being either audible or visible or a combination thereof. A reliable source of power is provided for actuation of the signal and this source of power is, preferably, in the form of a battery.

A switching arrangement is provided interposed between the battery and the signaling means and consisting of a three position manual switch in series with a two position relay operated switch. The relay is connected in circuit with the source of power to be monitored, for example, an alternating current supply line, with the aforementioned manual switch including a blade interposed between the relay and the power source.

A still further circuit can be provided including blades of the aforementioned switches in series and thereby, also, under the control of the alarm system.

The aforementioned manual switch has an "OFF" position in which the signaling means is disconnected from the source of power in which the relay circuit and the additional circuit referred to are both interrupted.

In a second ON position of the manual switch, the relay is connected to the source of power to be monitored and is thereby energized while a signal lamp connected across the relay is also illuminated. Further, the battery is connected through a blade of the manual switch and a blade of the relay operated switch to the signaling means and the signaling means is thereby actuated. This position of the manual switch, thus, provides a check on the operation of the system while also providing a "POWER RETURN" position of the manual switch.

In a still further LOSS position of the manual switch, the relay remains energized through the respective blade of the manual switch while the battery for the signaling means is connected through its manual switch blade to a contact of the respective relay operated switch blade which is engaged by the switch blade only when the relay is de-energized. With the manual switch in the last mentioned LOSS position, the signaling means is in unactuated condition and will only be actuated when the relay switch moves to its de-energized position indicating loss of energy to the relay coil and, thus, loss of power in the circuit being monitored.

In the third position of the manual switch, the additional circuit referred to is also interrupted and is only re-established with the manual switch in the last mentioned LOSS position when the relay coil becomes de-energized through loss of power thereto.

The relay can be designed to open when a predetermined loss of voltage occurs in the power supply whereby an alarm signal sounds when a low voltage situation arises.

If, when the alarm signal is actuated upon loss of power, or upon reduction in the voltage of the power supply, the manual switch is placed in the ON position thereof, and which can also be referred to as a RETURN position, a signal will be given when the power returns to rated voltage from a low voltage condition or when the power returns from a no voltage condition.

The exact nature of the present invention will become more clearly apparent upon reference to the following detailed specification taken in connection with the accompanying drawing.

DETAILED DESCRIPTION OF THE INVENTION

Referring to the drawing in detail, a relay coil K1 is provided and controls switch blades K1a and K1b. When the relay coil K1 is de-energized, the blades K1a and K1b close on the upper contacts 10 and 12, respectively, and when the relay is energized, the blades close on the lower contacts 14 and 16, respectively.

A signal light 18, which is optional, and which may be in the form of a neon lamp, may be connected in parallel with relay coil K1.

A manual switch is provided having blades S1a and S1b and S1c and adapted for movement into any one of three positions by a control knob 20.

In one position, indicated as OFF on the drawing, the blades close on contacts 22, 24 and 26, respectively, and the system is, accordingly, in idle condition.

In a second position of manual switch indicated as the ON position, the blades close on contacts 28, 30 and 32, respectively.

Blade S1a is connected to one side of the power supply 34 which is to be monitored while the other side of the power supply is connected with one end of relay coil K1 and one side of lamp 18. Contact 28 is connected to the other end of relay coil K1 and the other side of lamp 18 and, thus, when blade S1a closes on contact 28, relay coil K1 will be energized and lamp 18 will be illuminated and blades K1a and K1b will close on their respective contacts 14 and 16.

Blade S1b is connected to battery 48 and, in the second position of the manual switch, blade S1b closes on contact 30. Contact 30 is connected to contact 14 on which blade K1a is closed so that the signal means, indicated at 36, is energized. As mentioned, the signal means can either be audible or visible, or both, and may comprise record means for maintaining a chart of power loss time, or a timer for timimg periods of power loss.

In the second ON position of the manual switch, blade S1c closes on contact 32 which is connected to contact 16 on which blade K1b closes when relay coil K1 is energized so that an external additional circuit, consisting of a wire 38 connected to blade K1 and wire 40 connected to blade S1c, is completed.

The above described position of the manual switch is the checking position because the additional circuit will be closed, and the signal means 36 will be energized only if the system is in proper working order.

The third, LOSS, position of the manual switch is the operating position, and in this position, the blades S1a, S1b and S1c close on contacts 42, 44 and 46, respectively. When the manual switch is in the last mentioned position, relay coil K1 remains energized as long as the power supply 34 is maintained at the rated voltage, but signaling means 36 is not activated because contact 44 pertaining to switch blade S1b is connected to contact 10 pertaining to blade K1a on which the blade is not at this time closed.

The external control circuit, made up of wires 38 and 40, is also, at this time, interrupted.

If, however, the source of power at 34 fails or is interrupted, or, as mentioned undergoes a predetermined loss of voltage, relay coil K1 will not hold the relay armature in actuated position and blade K1a will close on contact 10 and blade K1b will close on contact 12. With blade K1a closed on contact 10, a circuit is established from battery 48 connected to blade S1b to contact 44 and then to contact 10 and then through blade K1a to the signaling means 36.

The external control circuit, made up of wires 38 and 40, is also completed via blade K1b.

With the signaling means 36 now energized, the failed, or reduced voltage, condition of the main power supply is indicated and suitable corrective measures can be taken.

At this time, the manual switch is adjusted back to the intermediate ON position thus deactivating the signal 36. When the power supply is restored, or when the voltage thereof returns to the rated value, the armature of the relay will return to actuated position and signal 36 will again be actuated via contacts 30 and 14. When the signal is actuated, the monitored systems can again be restored to operating condition. The manual switch is then again moved to the LOSS position thereof to restore the original condition thereby to deactivate the signaling means while preparing the circuit again to detect loss of the main power supply, or reduction in voltage thereof.

The signaling means 36 can, on occasion, be self powered, as by a spring, and be released into signaling condition by a voltage signal thereto.

The battery forming the second source of power in the arrangement according to the present invention could, of course, be of the rechargeable type with charging means being provided supplied by the main power source so that the battery means would remain fully charged at all times and, thus, be ready for emergency use upon failure, or loss of voltage, of the main power source.

Modifications may be made within the scope of the appended claims.

What is claimed is:

1. In a system for monitoring a main source of electric power; a relay having a coil supplied by the main source of power and having at least one blade, a second source of electric power, a manual switch having at least one blade, each blade having at least two operative positions and closing on respective contacts in said positions, each contact pertaining to the manual switch blade being connected to a respective contact of the relay blade, said second source of power being connected to one of said blades, signalling means having a voltage sensitive control terminal, said terminal being connected to the other of said blades, said manual switch including a second blade interposed between said main source and said coil, said manual switch blades having a further OFF position wherein the circuit between said main source and said relay coil and between said second source and said terminal of said signalling means are interrupted.

2. A system according to claim 1 in which said second blade of said manual switch is connected to said one blade thereof for movement of the blades in unison, said second blade completing the circuit from said main power source to said relay coil in each of the first two mentioned positions of the said one blade of said manual switch.

3. A system according to claim 1 in which each of said relay and manual switch includes a further blade connected to move with the said one blade thereof, and an auxiliary circuit including said further blades which is completed in only two of the possible combinations of positions of said further blades.

4. A system according to claim 1 in which said second source of power comprises a battery.

5. A system according to claim 1 in which said signalling means is electrically operable.

6. A system according to claim 1 in which said relay moves the blade thereof into one operative position when the relay coil is supplied with voltage at the rated voltage of said power supply and moves the said blade thereof into the second operative position when the voltage supplied to the relay coil drops a predetermined amount below said rated voltage.

* * * * *